USO12261584B2

(12) United States Patent
Peng et al.

(10) Patent No.: US 12,261,584 B2
(45) Date of Patent: Mar. 25, 2025

(54) VIBRATION-ABSORBING STRUCTURE FOR PACKAGING A CRYSTAL RESONATOR

(71) Applicant: TXC CORPORATION, Taipei (TW)

(72) Inventors: Tzu-Hsiu Peng, Ping Cheng (TW); Wei-Chen Lo, Ping Cheng (TW); Zong-De Lin, Ping Cheng (TW)

(73) Assignee: TXC Corporation, Taipei (TW)

( * ) Notice: Subject to any disclaimer, the term of this patent is extended or adjusted under 35 U.S.C. 154(b) by 848 days.

(21) Appl. No.: 17/373,972

(22) Filed: Jul. 13, 2021

(65) Prior Publication Data

US 2022/0321089 A1 Oct. 6, 2022

(30) Foreign Application Priority Data

Mar. 30, 2021 (TW) .................................. 110111483

(51) Int. Cl.
*H03H 9/09* (2006.01)
*H03H 9/10* (2006.01)
*H03H 9/19* (2006.01)

(52) U.S. Cl.
CPC ............ *H03H 9/09* (2013.01); *H03H 9/1035* (2013.01); *H03H 9/19* (2013.01)

(58) Field of Classification Search
CPC ........ H10N 30/02; H10N 30/01; H10N 30/88; H03H 9/02157; H03H 9/19; H03H 9/1035; H03H 9/09
See application file for complete search history.

(56) References Cited

U.S. PATENT DOCUMENTS

| 9,261,669 B2* | 2/2016 | Horie ................. H10N 30/2044 |
| 9,299,910 B1* | 3/2016 | Sparks ............... H03H 9/02338 |
| 11,360,300 B2* | 6/2022 | Ogata ................ G02B 26/0858 |
| 2011/0032590 A1* | 2/2011 | Terada ............... H10N 30/2044 |
| | | 310/366 |
| 2014/0355089 A1* | 12/2014 | Murayama ......... G02B 26/0841 |
| | | 359/199.1 |

(Continued)

FOREIGN PATENT DOCUMENTS

| JP | 61030334 A | 2/1986 |
| JP | 2000223995 A | 8/2000 |

(Continued)

OTHER PUBLICATIONS

International Patent Office Official Action issued by a Foreign Patent Office for corresponding Application No. 2021-128378.

(Continued)

*Primary Examiner* — J. San Martin
*Assistant Examiner* — Jaydi San Martin
(74) *Attorney, Agent, or Firm* — Rosenberg, Klein & Lee (57) ABSTRACT

A vibration-absorbing structure for packaging a crystal resonator includes a package base, a resonant crystal blank, and a top cover. The top of the package base has a recess. The sidewall of the package base surrounds the recess. The resonant crystal blank has a border area, at least one serpentine connection area, and a resonant area. The serpentine connection area is connected between the border area and the edge of the resonant area. The border area is arranged on the sidewall. The top cover, arranged on the border area, covers the recess, the at least one serpentine connection area, and the resonant area.

8 Claims, 10 Drawing Sheets

(56) References Cited

U.S. PATENT DOCUMENTS

| | | | | |
|---|---|---|---|---|
| 2015/0049155 A1* | 2/2015 | Morikawa | ............ | H10N 30/802 |
| | | | | 310/317 |
| 2015/0362724 A1* | 12/2015 | Ikegami | ............. | G02B 26/0858 |
| | | | | 359/199.4 |
| 2016/0028370 A1* | 1/2016 | Nakagawa | ............. | H03H 9/215 |
| | | | | 29/25.35 |
| 2020/0290865 A1* | 9/2020 | Umeda | ................ | H03H 3/0072 |

FOREIGN PATENT DOCUMENTS

| | | | |
|---|---|---|---|
| JP | 2008017408 A | 1/2008 |
| JP | 2008166903 A | 7/2008 |
| JP | 2012151651 A | 8/2012 |
| TW | 201143283 A1 | 12/2011 |
| TW | 201338222 A | 9/2013 |

OTHER PUBLICATIONS

Second Notice of Refusal for Counterpart Japanese Patent Application No. 2021-128378 mailed on Jul. 3, 2023.
Examination Report mailed to the Corresponding Chinese Patent Application No. 202110720978.5 dated Apr. 30, 2024.

* cited by examiner

VIBRATION-ABSORBING STRUCTURE FOR PACKAGING A CRYSTAL RESONATOR

This application claims priority of Application No. 110111483 filed in Taiwan on 30 Mar. 2021 under 35 U.S.C. § 119; the entire contents of all of which are hereby incorporated by reference.

BACKGROUND OF THE INVENTION

Field of the Invention

The present invention relates to a package structure, particularly to a vibration-absorbing structure for packaging a crystal resonator.

DESCRIPTION OF THE RELATED ART

Quartz elements have stable piezoelectric characteristics, which can provide accurate and wide reference frequency, clock control, timing functions, and noise filtering functions. In addition, quartz elements can also be used as sensors for vibration and pressure and important optical components. As a result, the quartz components play an important role in electronic products.

Figure 1:
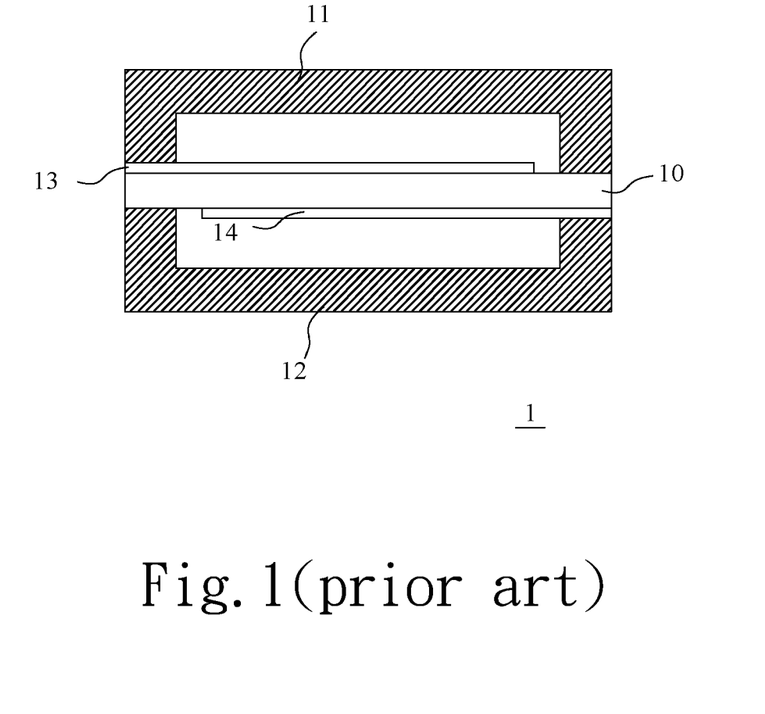
FIG. 1 is a schematic diagram illustrating a quartz resonator in the conventional technology.

FIG. 1 is a schematic diagram illustrating a quartz resonator in the conventional technology. Referring to FIG. 1, the quartz resonator 1 is comprised of a quartz crystal resonator element 10 and first and second casings 11 and 12 as covers provided so as to sandwich and cover the quartz crystal resonator element 10. The quartz crystal resonator element 10 is constituted using a quartz crystal substrate. In the quartz crystal resonator element 10, a main vibrating portion, which has excitation electrodes 13 and 14 formed on upper and lower surfaces thereof, is integrally formed with a supporting portion provided so as to surround the main vibrating portion. The first and second casings 11 and 12 are, for example, made of versatile glass such as blue plate glass. The first and second casings 11 and 12 have peripherally-formed protrusions, respectively, at outer peripheries thereof. The first and second casings 11 and 12 are bonded to the supporting portion at the protrusions so as to sandwich the quartz crystal resonator element 10 therebetween. Since the area ratio of the supporting portion to the quartz crystal resonator element 10 is higher, the external mechanical vibration or the sudden shock is transmitted to the main vibrating portion such that the vibrating frequency of the quartz resonator 1 is unstable.

To overcome the abovementioned problems, the present invention provides a vibration-absorbing structure for packaging a crystal resonator, so as to solve the afore-mentioned problems of the prior art.

SUMMARY OF THE INVENTION

The present invention provides a vibration-absorbing structure for packaging a crystal resonator, which avoids transmitting the external mechanical vibration or the sudden shock to a resonant crystal blank, thereby stabilizing the resonant frequency.

In an embodiment of the present invention, a vibration-absorbing structure for packaging a crystal resonator includes a package base, a resonant crystal blank, and a top cover. The top of the package base has a recess. The sidewall of the package base surrounds the recess. The resonant crystal blank has a border area, at least one serpentine connection area, and a resonant area. The serpentine connection area is connected between the border area and the edge of the resonant area. The border area is arranged on the sidewall. The top cover, arranged on the border area, covers the recess, the serpentine connection area, and the resonant area.

In an embodiment of the present invention, the vibration-absorbing structure further includes a first electrode layer, a second electrode layer, a first seal ring, a second seal ring, and a plurality of conductive pads. The first electrode layer is arranged on the bottom surfaces of the serpentine connection area and the resonant area and electrically connected to the resonant area. The second electrode layer is arranged on the top surfaces of the serpentine connection area and the resonant area and electrically connected to the resonant area. The first seal ring is arranged between the sidewall of the package base and the border area. The second seal ring is arranged between the border area and the top cover. The plurality of conductive pads is arranged on a bottom surface of the package base.

In an embodiment of the present invention, the serpentine connection area includes a first connection arm, a second connection arm, and a third connection arm. The first connection arm has a first end and a second end. The first end is connected to the edge of the resonant area. The second connection arm has a third end and a fourth end. The third end is connected to the second end. The second connection arm is vertically connected to the first connection arm. The third connection arm has a fifth end and a sixth end. The fifth end is connected to the fourth end. The sixth end is connected to the border area. The third connection arm is vertically connected to the second connection arm.

In an embodiment of the present invention, the serpentine connection area further includes a fourth connection arm and a fifth connection arm. The fourth connection arm has a seventh end and an eighth end. The seventh end is connected to the sixth end. The fourth connection arm is vertically connected to the third connection arm. The fifth connection arm has a ninth end and a tenth end. The ninth end is connected to the eighth end. The tenth end is connected to the border area. The fifth connection arm is vertically connected to the fourth connection arm.

In an embodiment of the present invention, the serpentine connection area further includes a sixth connection arm and a seventh connection arm. The sixth connection arm has an eleventh end and a twelfth end. The eleventh end is connected to the tenth end. The sixth connection arm is vertically connected to the fifth connection arm. The seventh connection arm has a thirteenth end and a fourteenth end. The thirteenth end is connected to the twelfth end. The fourteenth end is connected to the border area. The seventh connection arm is vertically connected to the sixth connection arm.

In an embodiment of the present invention, the at least one serpentine connection area includes a plurality of serpentine connection areas uniformly connected between the edge of the resonant area and the border area.

In an embodiment of the present invention, the resonant area has a shape of a rectangle.

In an embodiment of the present invention, the serpentine connection area is connected to a long edge of the rectangle, a distance between a position where the serpentine connection area is connected to the border are and a position where the serpentine connection area is connected to the edge of the resonant area is D1, the rectangle has a width of W, $D1=C1 \times W$, and $C1=0.8\sim1.2$.

In an embodiment of the present invention, the serpentine connection area is connected to a short edge of the rectangle, a distance between a position where the serpentine connection area is connected to the border area and a position where the serpentine connection area is connected to the edge of the resonant area is D2, the rectangle has a length of L, D2=C2×L, and C2=0.8~1.2.

In an embodiment of the present invention, the border area, the at least one serpentine connection area, and the resonant area are integrally formed as a piece.

To sum up, the vibration-absorbing structure for packaging a crystal resonator forms the serpentine connection area between the border area and the resonant area to avoid transmitting the external mechanical vibration or the sudden shock to a resonant crystal blank, thereby stabilizing the resonant frequency.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present. The term "and/or" may comprise any and all combinations of one or more of the associated listed items Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, particular components, structures, and features in one or more embodiments can be combined in an appropriate manner.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

As used herein, whether in the written description or the claims, the terms "comprising", "including", "having", "containing", "involving", and the like are to be understood to be open-ended, i.e., to mean including but not limited to. In addition, any embodiment of the present invention or the scope of the patent application does not need to achieve all the objectives or advantages or have features disclosed in the present invention. In addition, the abstract and title are only used to assist in searching for patents rather than to limit the scope of the present invention.

Figure 2:
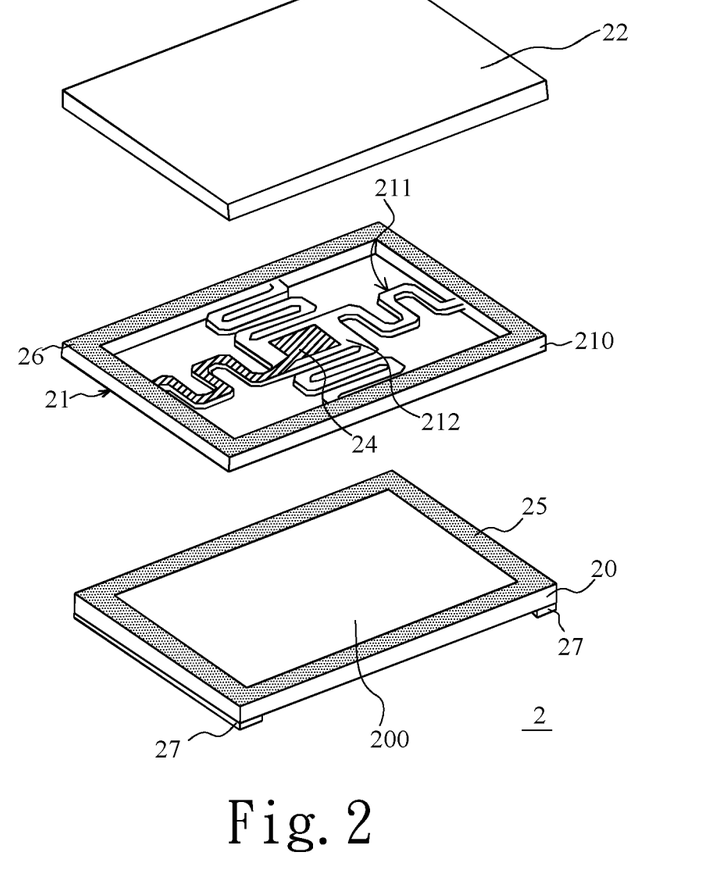
FIG. 2 is an exploded view of a vibration-absorbing structure for packaging a crystal resonator according to an embodiment of the present invention.
Figure 3:
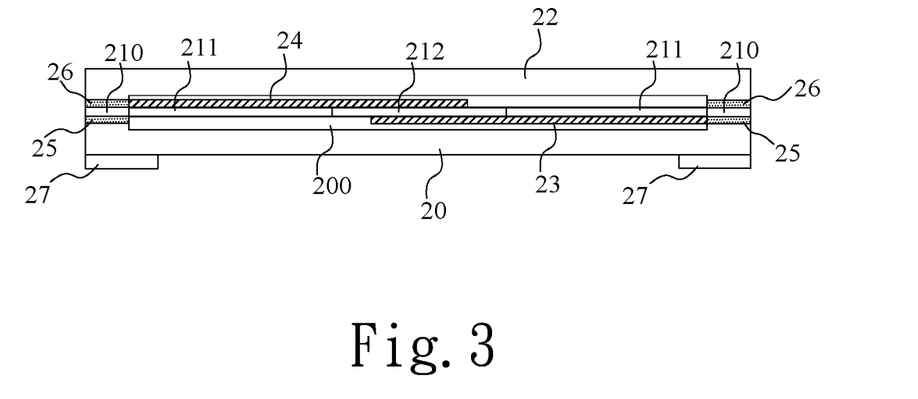
FIG. 3 is a cross-sectional view of a vibration-absorbing structure for packaging a crystal resonator according to an embodiment of the present invention.

FIG. 2 is an exploded view of a vibration-absorbing structure for packaging a crystal resonator according to an embodiment of the present invention. FIG. 3 is a cross-sectional view of a vibration-absorbing structure for packaging a crystal resonator according to an embodiment of the present invention. Referring to FIG. 2 and FIG. 3, the vibration-absorbing structure 2 for packaging a crystal resonator of the present invention is introduced as follows. The vibration-absorbing structure 2 includes a package base 20, a resonant crystal blank 21, and a top cover 22. The top of the package base 20 has a recess 200. The sidewall of the package base surrounds the recess 200. The resonant crystal blank 21 may be a quartz crystal blank. The resonant crystal blank 21 has a border area 210, at least one serpentine connection area 211, and a resonant area 212. The serpentine connection area 211 has a curved shape and a vibration-absorbing function. The serpentine connection area 211 is connected between the border area 210 and the edge of the resonant area 212. The border area 210 is arranged on the sidewall of the package base 20. The border area 210, the serpentine connection area 211, and the resonant area 212 may be integrally formed as a piece. The top cover 22, arranged on the border area 210, covers the recess 200, the serpentine connection area 211, and the resonant area 212. Since the serpentine connection area 211 is formed between the border area 210 and the resonant area 212, the external mechanical vibration or the sudden shock are not transmitted to the resonant area 212, thereby stabilizing the resonant frequency.

In some embodiments of the present invention, the vibration-absorbing structure 2 may further include a first electrode layer 23, a second electrode layer 24, a first seal ring 25, a second seal ring 26, and a plurality of conductive pads 27. The first electrode layer 23 is arranged on the bottom surfaces of the serpentine connection area 211 and the resonant area 212 and electrically connected to the resonant area 212. The second electrode layer 24 is arranged on the top surfaces of the serpentine connection area 211 and the resonant area 212 and electrically connected to the resonant area 212. The first seal ring 25 is arranged between the sidewall of the package base 20 and the border area 210. The second seal ring 26 is arranged between the border area 210 and the top cover 22. All the conductive pads 27 are arranged on the bottom surface of the package base 20.

Figure 4:
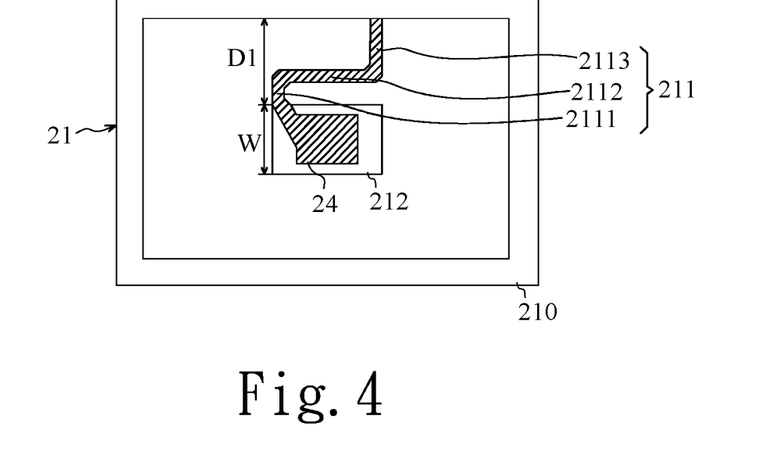
FIGS. 4-18 are top views of a resonant crystal blank and a first electrode layer according to various embodiments of the present invention.

FIGS. 4-18 are top views of a resonant crystal blank and a first electrode layer according to various embodiments of the present invention. Referring to FIG. 2 and FIG. 4, the number of the serpentine connection area 211 is one. The serpentine connection area 211 may include a first connection arm 2111, a second connection arm 2112, and a third connection arm 2113. The first connection arm 211 has a first end and a second end. The first end is connected to the edge of the resonant area 212. The second connection arm 2112 has a third end and a fourth end. The third end is connected to the second end. The second connection arm 2112 is vertically connected to the first connection arm 2111. The third connection arm 2113 has a fifth end and a sixth end. The fifth end is connected to the fourth end. The sixth end is connected to the border area 210. The third connection arm 2113 is vertically connected to the second connection arm 2112. For example, the resonant area 212 has a shape of a rectangle. When the serpentine connection area 211 is connected to the long edge of the rectangle, a distance between a position where the serpentine connection area 211 is connected to the border are 210 and a position where the serpentine connection area 211 is connected to the edge of the resonant area 212 is D1. The rectangle has a width of W, D1=C1×W, and C1=0 0.8~1.2.

Figure 5:
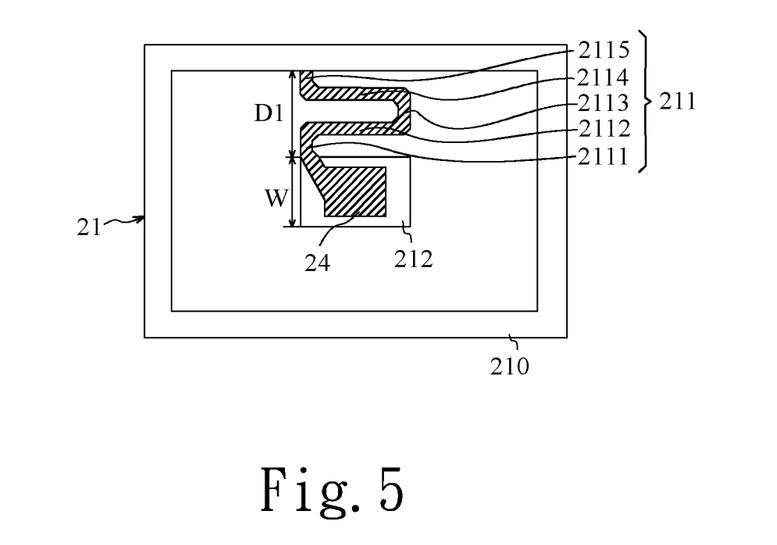

Refer to FIG. 2 and FIG. 5. Compared with the embodiment of FIG. 4, the serpentine connection area 211 may further include a fourth connection arm 2114 and a fifth connection arm 2115. The fourth connection arm 2114 has a seventh end and an eighth end. The seventh end is connected to the sixth end. The fourth connection arm 2114 is vertically connected to the third connection arm 2113. The fifth connection arm 2115 has a ninth end and a tenth end. The ninth end is connected to the eighth end. The tenth end is connected to the border area 210. The fifth connection arm 2115 is vertically connected to the fourth connection arm 2114. D1=C1×W, and C1=0.8~1.2.

Figure 6:
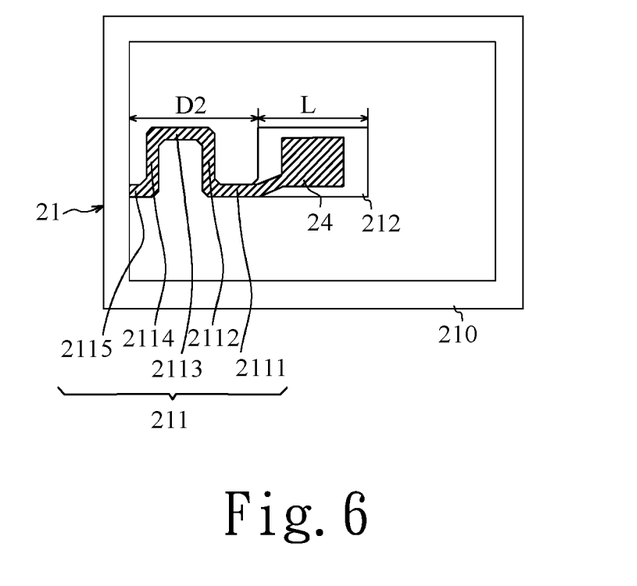

Refer to FIG. 2 and FIG. 6. Compared with the embodiment of FIG. 5, the serpentine connection area 211 is connected to the short edge of the rectangle, and a distance between a position where the serpentine connection area 211 is connected to the border area 210 and a position where the serpentine connection area 211 is connected to the edge of the resonant area 212 is D2. The rectangle has a length of L, D2=C2×L, and C2=0.8~1.2.

Figure 7:
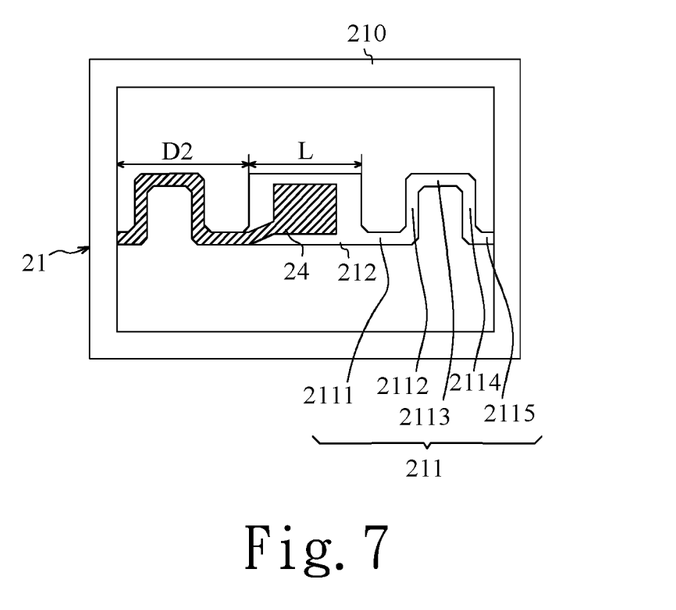

Refer to FIG. 2 and FIG. 7. Compared with the embodiment of FIG. 6, the number of the serpentine connection areas 211 is two. The two serpentine connection areas 211 are opposite to each other. D2=C2×L, and C2=0.8~1.2.

Figure 8:
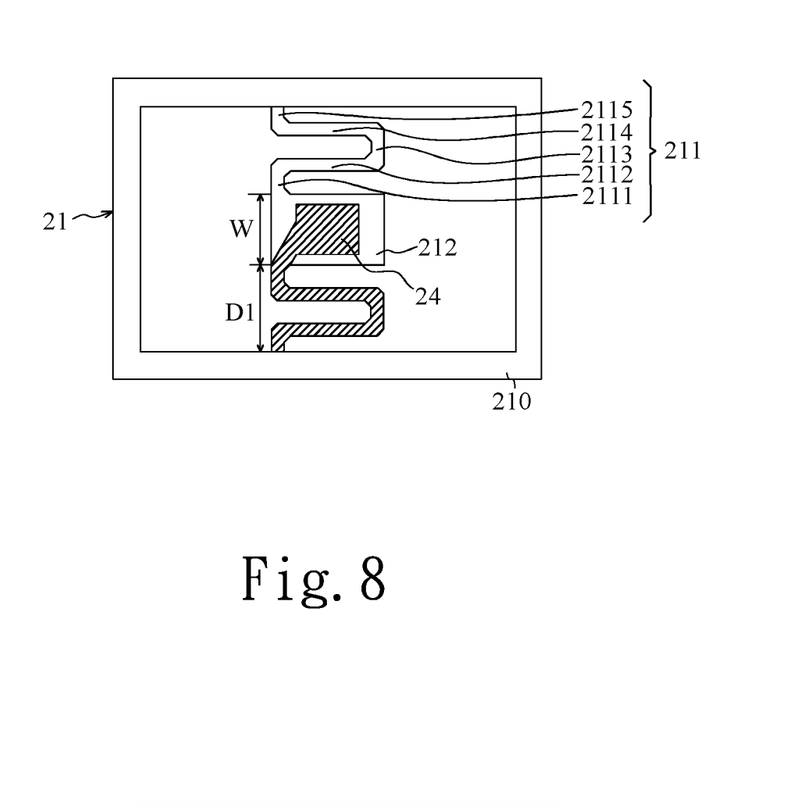

Refer to FIG. 2 and FIG. 8. Compared with the embodiment of FIG. 5, the number of the serpentine connection areas 211 is two. The two serpentine connection areas 211 are opposite to each other. D1=C1×W, and C1=0.8~1.2.

Figure 9:
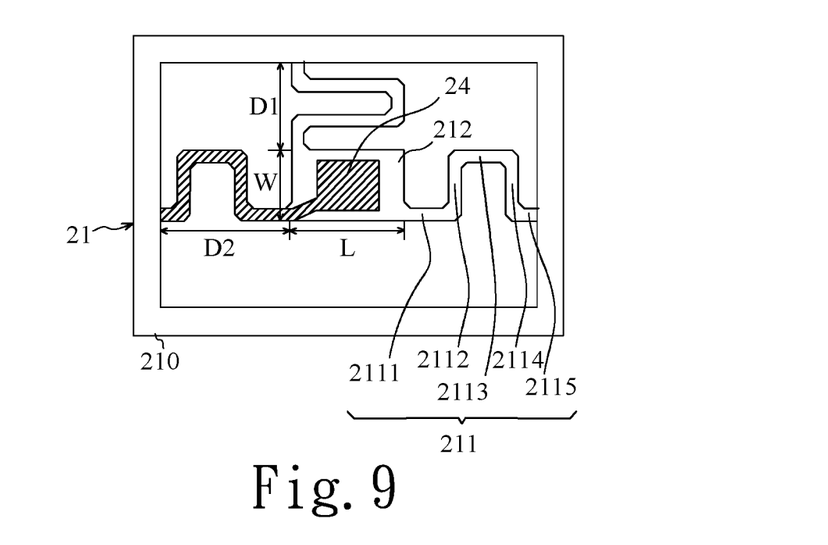

Refer to FIG. 2 and FIG. 9. Compared with the embodiment of FIG. 5, the number of the serpentine connection areas 211 is three. Two of the serpentine connection areas 211 are opposite to each other. When the serpentine connection area 211 is connected to the short edge of the rectangle, a distance between a position where the serpentine connection area 211 is connected to the border area 210 and a position where the serpentine connection area 211 is connected to the edge of the resonant area 212 is D2. The rectangle has a length of L, D2=C2×L, and C2=0.8~1.2. D1=C1×W, and C1=0.8~1.2.

Figure 10:
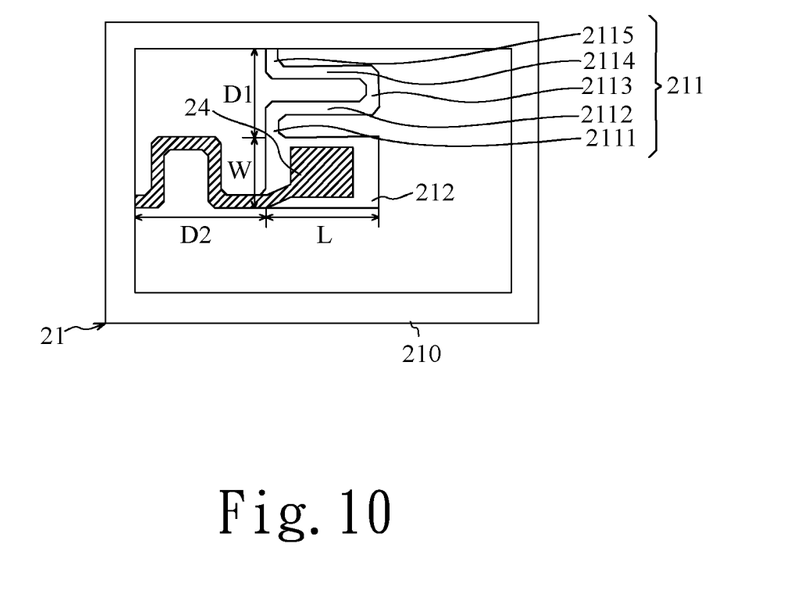

Refer to FIG. 2 and FIG. 10. Compared with the embodiment of FIG. 5, the number of the serpentine connection areas 211 is two. The two serpentine connection areas 211 are respectively connected to the short edge and the long edge of the rectangle. When the serpentine connection area 211 is connected to the short edge of the rectangle, a distance between a position where the serpentine connection area 211 is connected to the border area 210 and a position where the serpentine connection area 211 is connected to the edge of the resonant area 212 is D2. The rectangle has a length of L, D2=C2×L, and C2=0.8~1.2. D1=C1×W, and C1=0.8~1.2.

Figure 11:
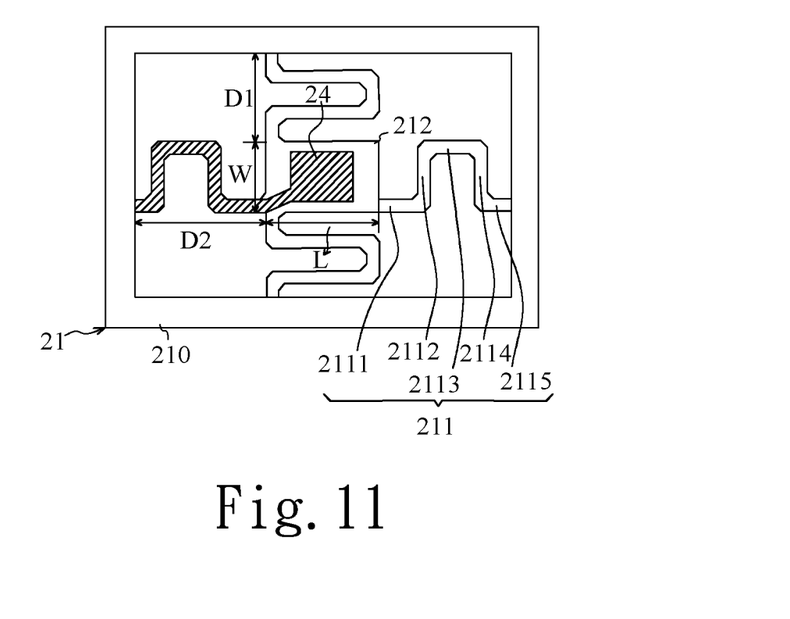

Refer to FIG. 2 and FIG. 11. Compared with the embodiment of FIG. 9, there are a plurality of serpentine connection areas 211. For example, the number of the serpentine connection areas 211 is four. All the serpentine connection areas 211 are uniformly connected between the edge of the resonant area 212 and the border area 210. D2=C2×L, and C2=0.8~1.2. D1=C1×W, and C1=0.8~1.2.

Figure 12:
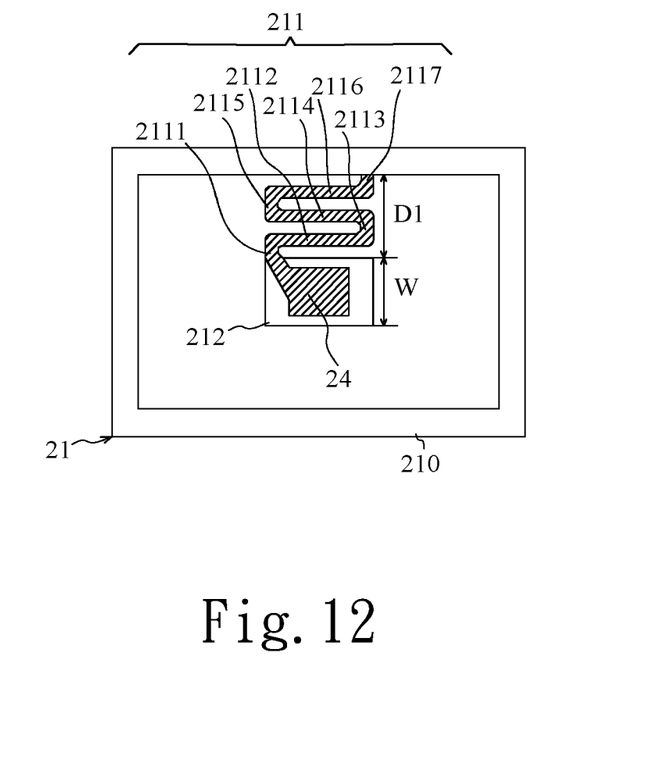

Refer to FIG. 2 and FIG. 12. Compared with the embodiment of FIG. 5, the serpentine connection area 211 may further include a sixth connection arm 2116 and a seventh connection arm 2117. The sixth connection arm 2116 has an eleventh end and a twelfth end. The eleventh end is connected to the tenth end. The sixth connection arm 2116 is vertically connected to the fifth connection arm 2115. The seventh connection arm 2117 has a thirteenth end and a fourteenth end. The thirteenth end is connected to the twelfth end. The fourteenth end is connected to the border area 210. The seventh connection arm 2117 is vertically connected to the sixth connection arm 2116. D1=C1×W, and C1=0.8~1.2.

Figure 13:
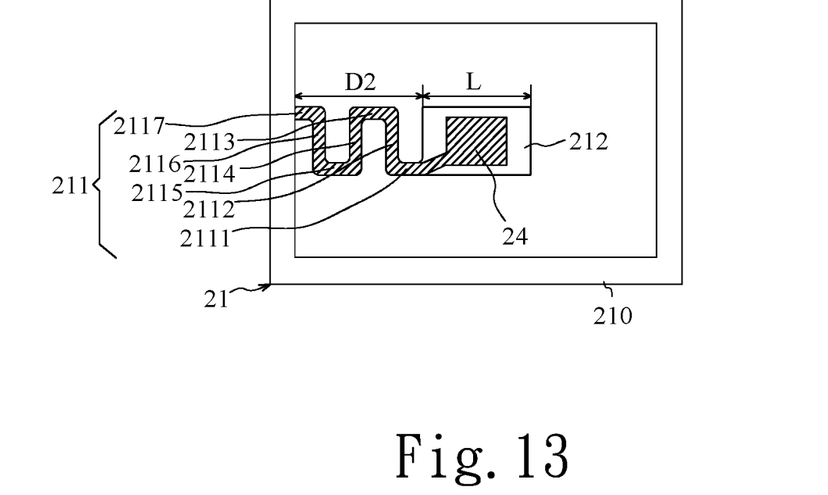

Refer to FIG. 2 and FIG. 13. Compared with the embodiment of FIG. 12, the serpentine connection area 211 is connected to the short edge of the rectangle, and a distance between a position where the serpentine connection area 211 is connected to the border area 210 and a position where the serpentine connection area 211 is connected to the edge of the resonant area 212 is D2. The rectangle has a length of L, D2=C2×L, and C2=0.8~1.2.

Figure 14:
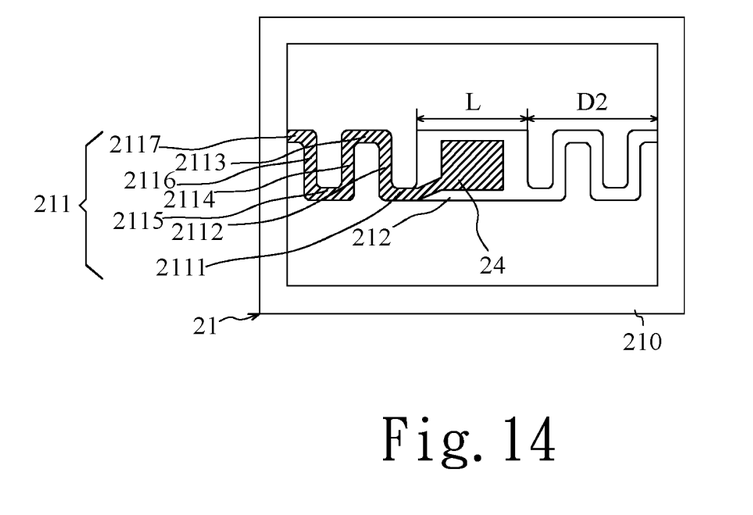

Refer to FIG. 2 and FIG. 14. Compared with the embodiment of FIG. 13, the number of the serpentine connection areas 211 is two. The two serpentine connection areas 211 are opposite to each other. D2=C2×L, and C2=0.8~1.2.

Figure 15:
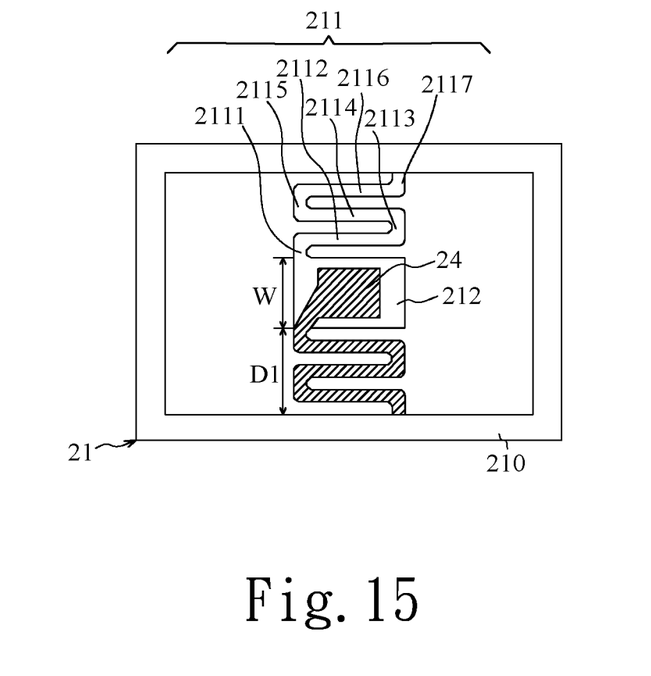

Refer to FIG. 2 and FIG. 15. Compared with the embodiment of FIG. 12, the number of the serpentine connection areas 211 is two. The two serpentine connection areas 211 are opposite to each other. D1=C1×W, and C1=0 0.8~1.2.

Figure 16:
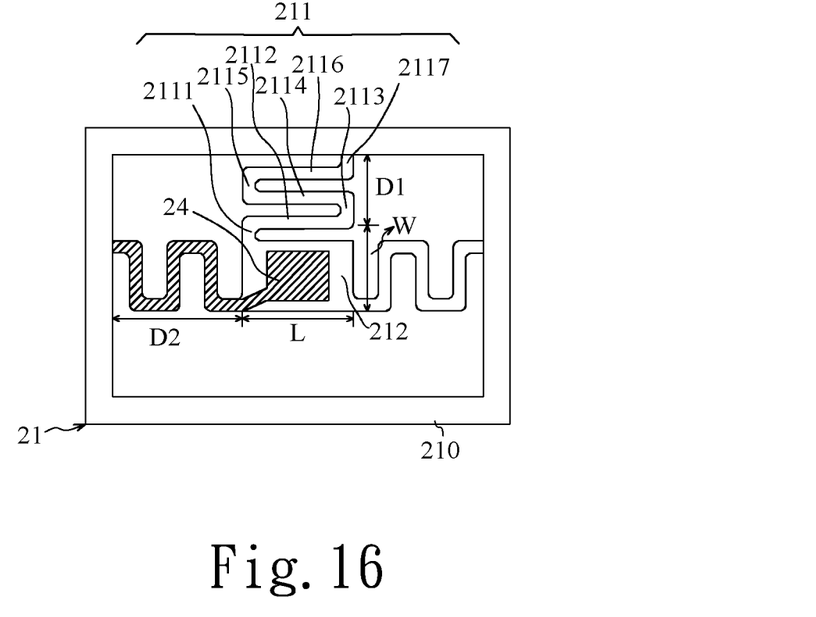

Refer to FIG. 2 and FIG. 16. Compared with the embodiment of FIG. 12, the number of the serpentine connection areas 211 is three. Two of the serpentine connection areas 211 are opposite to each other. When the serpentine connection area 211 is connected to the short edge of the rectangle, a distance between a position where the serpentine connection area 211 is connected to the border area 210 and a position where the serpentine connection area 211 is connected to the edge of the resonant area 212 is D2. The rectangle has a length of L, D2=C2×L, and C2=0.8~1.2. D1=C1×W, and C1=0.8~1.2.

Figure 17:
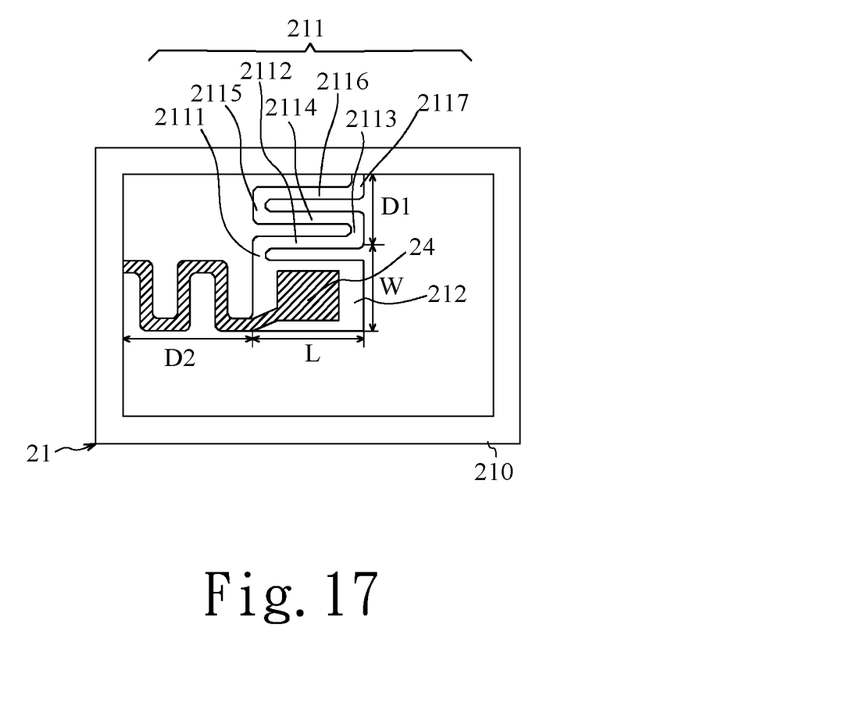

Refer to FIG. 2 and FIG. 17. Compared with the embodiment of FIG. 12, the number of the serpentine connection areas 211 is two. The two serpentine connection areas 211 are respectively connected to the short edge and the long edge of the rectangle. When the serpentine connection area 211 is connected to the short edge of the rectangle, a distance between a position where the serpentine connection area 211 is connected to the border area 210 and a position where the serpentine connection area 211 is connected to the edge of the resonant area 212 is D2. The rectangle has a length of L, D2=C2×L, and C2=0.8~1.2. D1=C1×W, and C1=0.8~1.2.

Figure 18:
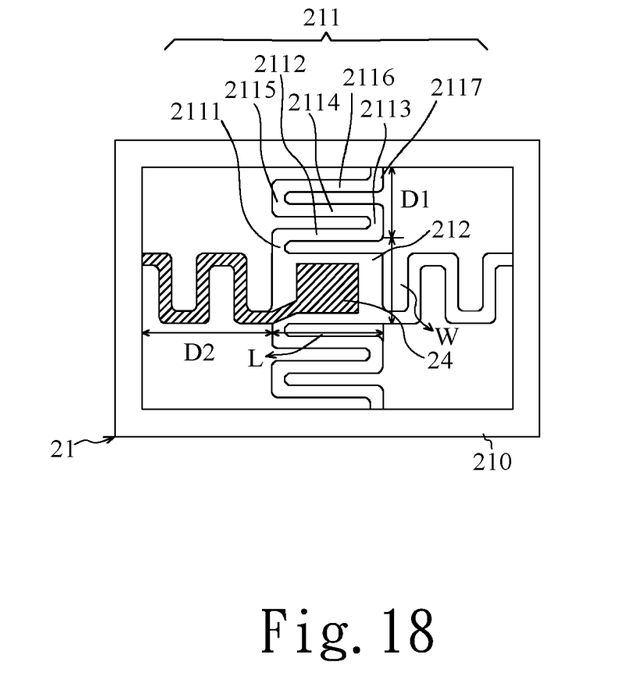

Refer to FIG. 2 and FIG. 18. Compared with the embodiment of FIG. 16, there are a plurality of serpentine connection areas 211. For example, the number of the serpentine connection areas 211 is four. All the serpentine connection areas 211 are uniformly connected between the edge of the resonant area 212 and the border area 210. D2=C2×L, and C2=0.8~1.2. D1=C1×W, and C1=0.8~1.2.

According to the embodiments provided above, the vibration-absorbing structure for packaging a crystal resonator forms the serpentine connection area between the border area and the resonant area to avoid transmitting the external mechanical vibration or the sudden shock to a resonant crystal blank, thereby stabilizing the resonant frequency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A vibration-absorbing structure for packaging a crystal resonator comprising:
a package base with a top thereof with a recess, wherein a sidewall of the package base surrounds the recess;
a resonant crystal blank having a border area, at least one serpentine connection area, and a resonant area, wherein the at least one serpentine connection area is connected between the border area and an edge of the resonant area, and the border area is arranged on the sidewall; and
a top cover, arranged on the border area, covering the recess, the at least one serpentine connection area, and the resonant area;
wherein the resonant area has a shape of a rectangle;
wherein when one end of the at least one serpentine connection area is connected to a corner and a long edge of the rectangle, another end of the at least one serpentine connection area is connected to an inner edge of the border area that is parallel and opposite to the long edge;
wherein when one end of the at least one serpentine connection area is connected to a corner and a short edge of the rectangle, another end of the at least one serpentine connection area is connected to an inner edge of the border area that is parallel and opposite to the short edge;
wherein an orthogonal projection location of one end of the at least one serpentine connection area that is connected to the rectangle onto the border area is a location where another end of the at least one serpentine connection area is connected to the border area;
wherein when two ends of a short edge or a long edge of the rectangle are respectively and orthogonally projected to the border area through two orthogonal projecting lines, the at least one serpentine connection area is completely located within an area surrounded by the two orthogonal projecting lines, the resonant area, and the border area;
wherein the at least one serpentine connection area comprises:
a first connection arm having a first end and a second end, wherein the first end is connected to the edge of the resonant area;
a second connection arm having a third end and a fourth end, wherein the third end is connected to the second end, and the second connection arm is vertically connected to the first connection arm; and
a third connection arm having a fifth end and a sixth end, wherein the fifth end is connected to the fourth end, the sixth end is connected to the border area, and the third connection arm is vertically connected to the second connection arm;
wherein when the second connection arm is arranged parallel to the long edge of the rectangle, a length of the second connection arm is equal to that of the long edge;
wherein when the second connection arm is arranged parallel to the short edge of the rectangle, a length of the second connection arm is equal to that of the short edge.

2. The vibration-absorbing structure for packaging a crystal resonator according to claim 1, further comprising:
a first electrode layer arranged on bottom surfaces of the at least one serpentine connection area and the resonant area and electrically connected to the resonant area;
a second electrode layer arranged on top surfaces of the at least one serpentine connection area and the resonant area and electrically connected to the resonant area;
a first seal ring arranged between the sidewall of the package base and the border area;
a second seal ring arranged between the border area and the top cover; and
a plurality of conductive pads arranged on a bottom surface of the package base.

3. The vibration-absorbing structure for packaging a crystal resonator according to claim 1, wherein the at least one serpentine connection area further comprises:
a fourth connection arm having a seventh end and an eighth end, wherein the seventh end is connected to the sixth end, and the fourth connection arm is vertically connected to the third connection arm; and a fifth connection arm having a ninth end and a tenth end, wherein the ninth end is connected to the eighth end, the tenth end is connected to the border area, and the fifth connection arm is vertically connected to the fourth connection arm.

4. The vibration-absorbing structure for packaging a crystal resonator according to claim 3, wherein the at least one serpentine connection area further comprises:

a sixth connection arm having an eleventh end and a twelfth end, wherein the eleventh end is connected to the tenth end, and the sixth connection arm is vertically connected to the fifth connection arm; and a seventh connection arm having a thirteenth end and a fourteenth end, wherein the thirteenth end is connected to the twelfth end, the fourteenth end is connected to the border area, and the seventh connection arm is vertically connected to the sixth connection arm.

5. The vibration-absorbing structure for packaging a crystal resonator according to claim 1, wherein the at least one serpentine connection area comprises a plurality of serpentine connection areas uniformly connected between the edge of the resonant area and the border area.

6. The vibration-absorbing structure for packaging a crystal resonator according to claim 1, wherein the at least one serpentine connection area is connected to a long edge of the rectangle, a distance between a position where the at least one serpentine connection area is connected to the border are and a position where the at least one serpentine connection area is connected to the edge of the resonant area is D1, the rectangle has a width of W, $D1=C1 \times W$, D1 and W have same units, and $C1=0.8~1.2$.

7. The vibration-absorbing structure for packaging a crystal resonator according to claim 1, wherein the at least one serpentine connection area is connected to a short edge of the rectangle, a distance between a position where the at least one serpentine connection area is connected to the border area and a position where the at least one serpentine connection area is connected to the edge of the resonant area is D2, the rectangle has a length of L, $D2=C2 \times L$, D2 and L have same units, and $C2=0.8~1.2$.

8. The vibration-absorbing structure for packaging a crystal resonator according to claim 1, wherein the border area, the at least one serpentine connection area, and the resonant area are integrally formed as a piece.

* * * * *